United States Patent
Kao et al.

(10) Patent No.: US 8,247,870 B2
(45) Date of Patent: Aug. 21, 2012

(54) POWER MOSFET INTEGRATION

(75) Inventors: Jungcheng Kao, San Jose, CA (US); Luming Guo, Shanghai (CN)

(73) Assignee: O2Micro, Inc., Santa Clara, CA (US)

( * ) Notice: Subject to any disclaimer, the term of this patent is extended or adjusted under 35 U.S.C. 154(b) by 348 days.

(21) Appl. No.: 11/903,879

(22) Filed: Sep. 25, 2007

(65) Prior Publication Data

US 2008/0073666 A1    Mar. 27, 2008

Related U.S. Application Data

(60) Provisional application No. 60/847,561, filed on Sep. 26, 2006.

(51) Int. Cl.
*H01L 29/772* (2006.01)
*H01L 21/336* (2006.01)

(52) U.S. Cl. ............... 257/337; 257/408; 257/E21.417; 257/E29.256; 438/306

(58) Field of Classification Search ............... 257/337, 257/408, E29.256, E21.417; 438/306
See application file for complete search history.

(56) References Cited

U.S. PATENT DOCUMENTS

| | | | |
|---|---|---|---|
| 5,156,989 A | 10/1992 | Williams et al. | |
| 5,204,541 A | 4/1993 | Smayling et al. | |
| 5,767,546 A | 6/1998 | Williams et al. | |
| 6,365,932 B1 | 4/2002 | Kouno et al. | |
| 6,830,725 B2 | 12/2004 | Fetcenko et al. | |
| 6,936,975 B2 | 8/2005 | Lin et al. | |
| 6,995,428 B2 | 2/2006 | Huang et al. | |
| 7,095,632 B2 | 8/2006 | Fukumoto | |
| 7,335,543 B2 | 2/2008 | Chen et al. | |
| 2002/0017697 A1* | 2/2002 | Kitamura et al. | 257/492 |
| 2003/0127689 A1 | 7/2003 | Hebert | |
| 2004/0051133 A1* | 3/2004 | Sugita et al. | 257/315 |
| 2004/0119116 A1 | 6/2004 | Byeon et al. | |
| 2005/0205926 A1 | 9/2005 | Chen et al. | |
| 2006/0011985 A1* | 1/2006 | Cai et al. | 257/369 |
| 2006/0055065 A1 | 3/2006 | Liu et al. | |

FOREIGN PATENT DOCUMENTS

| | | |
|---|---|---|
| CN | 1538793 A | 10/2004 |
| CN | 1661812 A | 8/2005 |
| CN | 1716550 A | 1/2006 |
| TW | 093108783 | 3/2005 |
| TW | I238593 B | 8/2005 |
| TW | I253801 B | 4/2006 |
| TW | 094130923 | 8/2006 |

* cited by examiner

*Primary Examiner* — Steven J Fulk

(57) ABSTRACT

A method for integration is disclosed herein. The method includes forming an N-type double drain (NDD) layer, and fabricating at least one transistor from a controller circuitry and a transistor switch on a single chip. The controller circuitry is operable for controlling the transistor switch.

18 Claims, 4 Drawing Sheets

POWER MOSFET INTEGRATION

RELATED APPLICATION

This application claims priority to U.S. Provisional Application No. 60/847,561, filed on Sep. 26, 2006, which is hereby incorporated by reference in its entirety.

FIELD OF THE INVENTION

The present invention relates to power transistors and more particularly to integration of power metal oxide semiconductor field effective transistors (MOSFETs).

BACKGROUND

During the past few decades, there has been an increasing interest in power metal oxide semiconductor field effective transistor (MOSFET) technologies for use in high-voltage (HV) applications that require power devices.

In conventional HV applications, a power MOSFET which functions as a switch is typically manufactured externally to an integrated circuit of a controller (e.g., an inverter controller) which controls ON/OFF of the power MOSFET, because several obstacles exist in the integration technology of the power MOSFET and the controller circuitry. For example, integrating the power MOSFET and the controller on a same chip will cause large die size and thus increasing the cost.

SUMMARY OF THE INVENTION

A method for fabricating an integrated circuit is disclosed herein. The method includes forming an N-type double diffused (NDD) layer, and fabricating at least one transistor from a controller circuitry and a transistor switch on a single chip. The controller circuitry is operable for controlling the transistor switch.

BRIEF DESCRIPTION OF THE DRAWINGS

Advantages of the present invention will be apparent from the following detailed description of exemplary embodiments thereof, which description should be considered in conjunction with the accompanying drawings, in which.

DETAILED DESCRIPTION OF THE INVENTION

Figure 1:
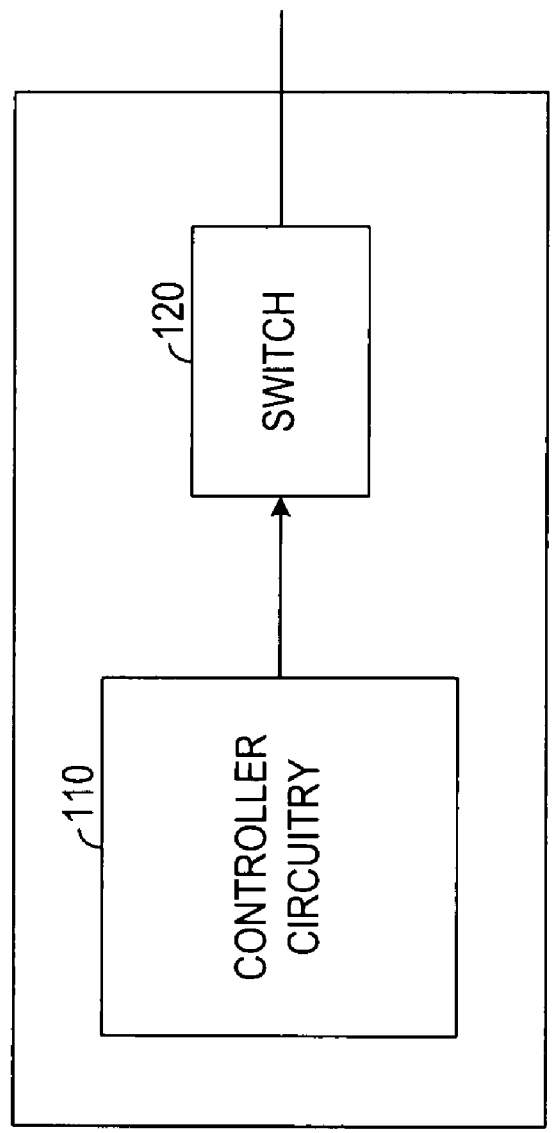
FIG. 1 illustrates a block diagram of an integrated circuit, in accordance with one embodiment of the present invention.

The present invention illustrates an integration circuit and method for fabricating a switch and a controller circuitry which controls the switch on a single chip. Since the embodiments shown in the drawings are for illustrative purposes, some sub-components and/or peripheral components generally incorporated in the invention are omitted herein for brevity and clarity. In describing the embodiments in accordance with the present invention, specific terminologies are employed for the sake of clarity. However, the disclosure of this patent specification is not intended to be limited to the selected terminology and the specified embodiments. It is understood that each specific element includes all technical equivalents that operate in a similar manner.

FIG. 1 illustrates a block diagram of an integrated circuit (IC) 100, in accordance with one embodiment of the present invention. Applications for the IC 100 can include, but are not limited to, high voltage (HV) electronic circuits (e.g., the operating voltage is higher than 5V), such as DC/DC converter, backlight inverter, battery charger controller, etc., that require one or more power semiconductor devices. The IC 100 can include a switch (e.g., current switch or voltage switch) 120 and a controller circuitry 110 for controlling the switch 120. Advantageously, the switch 120 and the controller circuitry 110 are integrated on a single chip, in one embodiment. The switch 120 can be a power metal oxide semiconductor field effective transistor (MOSFET).

In one embodiment, the IC 100 including the controller circuitry 110 and the switch 120 can be manufactured by metal oxide semiconductor (MOS) technology. In one embodiment, the controller circuitry 110 includes a plurality of MOS transistors. In one embodiment, the plurality of MOS transistors in the controller circuitry 110 can be manufactured as, but are not limited to, lateral diffused metal oxide semiconductor (LDMOS) transistors. The switch 120 can be manufactured as, but is not limited to, a double diffused drain metal oxide semiconductor (DDDMOS) transistor.

In one embodiment, the controller circuitry 110 comprises a plurality of LDMOS transistors. Advantageously, by using LDMOS transistors in the controller circuitry 110, the controller circuitry 110 can have an enhanced reliability compared to a controller circuitry using other types of transistors, in one embodiment. LDMOS transistors can operate when an operating voltage is high (e.g., 30V-40V), hence the controller circuitry 110 using LDMOS transistors can demonstrate an enhanced reliability. For example, the controller circuitry 110 using LDMOS transistors is able to possess sufficient tolerance towards undesired electrical/voltage stress conditions, e.g., in a hot carrier injection (HCI) test.

Furthermore, by using the DDDMOS transistor as the switch 120, the switch 120 can have a smaller size and a faster response compared to other types of transistor, e.g., an LDMOS transistor. In one embodiment, the drain of the switch (e.g., power MOSFET) 120 is selectively coupled to a maximum operating voltage or a lower voltage. More specifically, the drain voltage can drop to the lower voltage, e.g., to 0.5V when the switch (DDDMOS transistor) 120 is turned on and the drain voltage can restore to the maximum operating voltage (which can vary according to different applications) when the switch (DDDMOS transistor) 120 is turned off. In addition, the turn-on period (e.g., conduction period) of the switch 120 is relatively small under the control of the controller circuitry 110, in one embodiment. Hence, a HCI effect will not be induced in such operation and the switch (DDDMOS transistor) 120 can survive in a HV condition.

As a result, the IC 100 comprises a switch 120 which is a DDDMOS transistor, and a controller circuitry 110 which controls the switch 120 and includes a plurality of LDMOS transistors. Advantageously, the IC 100 is featured with an enhanced reliability and a smaller die size. In one embodiment, the co-existing of the LDMOS transistor and the DDDMOS transistor on a single chip can be achieved according to a fabrication process shown in FIG. 2. Using the fabrication process shown in FIG. 2, a punch-through capability of the DDDMOS transistor can be enhanced by adding an N-type double diffused (NDD) implant in the process. Consequently, the IC 100 including LDMOS and DDDMOS transistors can further enhance the reliability in high voltage applications.

Figure 2:
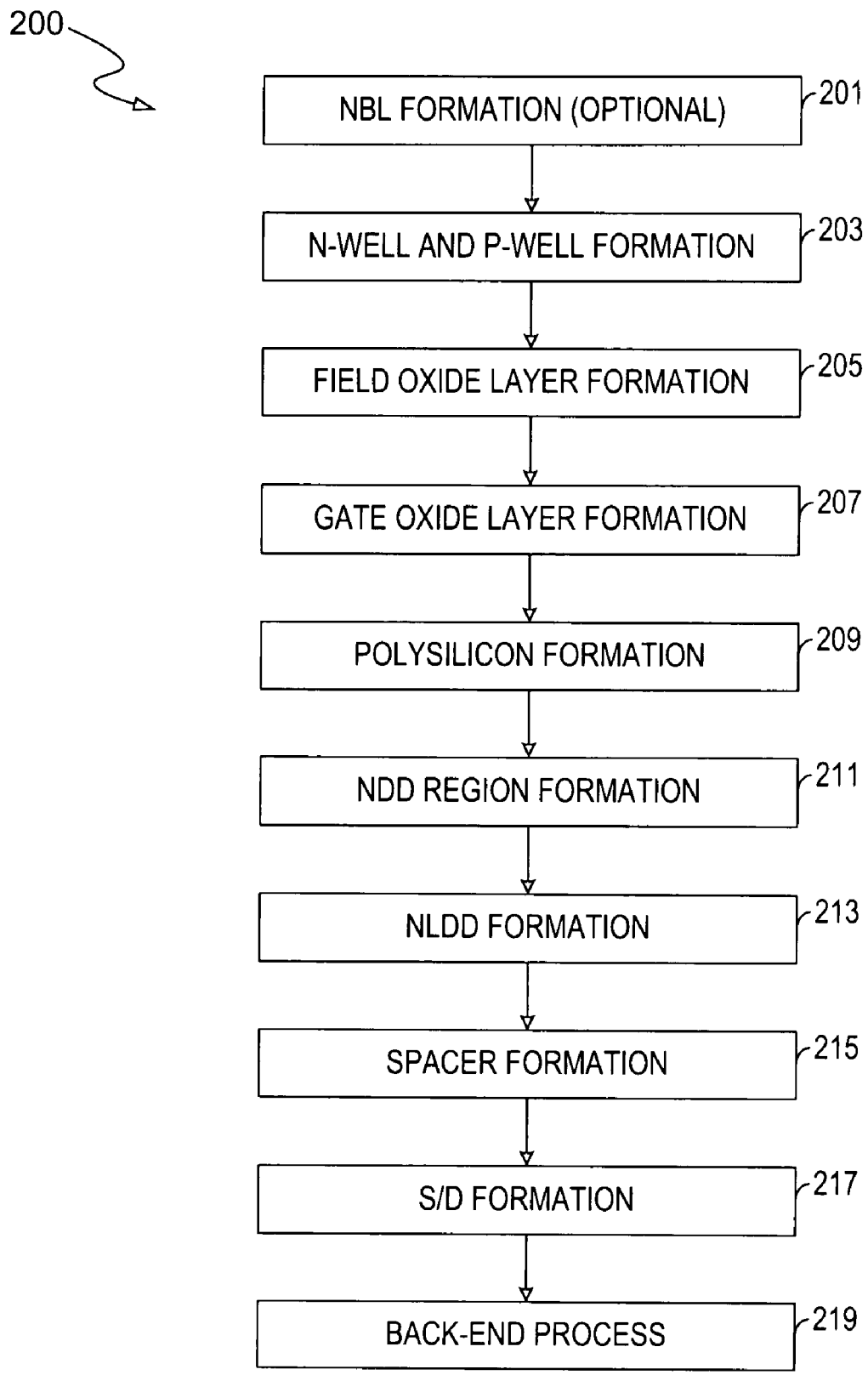
FIG. 2 illustrates a flowchart of a process for fabricating a switch and a controller circuitry on a single chip, in accordance with one embodiment of the present invention.

FIG. 2 illustrates a flowchart 200 of a process for fabricating a switch and a controller circuitry on a single chip, in accordance with one embodiment of the present invention. The flowchart 200 is described herein in combination with Table 1.

TABLE 1

| Step | Process |
|---|---|
| 1 | @ Wafer start |
| 2 | @ NBL mask |
| 3 | @ NBL implant |
| 4 | @ Drive in |
| 5 | @ P-epi deposition |
| 6 | @ N-well mask |
| 7 | @ N-well implant |
| 8 | @ Well oxide (drive-in) |
| 9 | @ P-well implant |
| 10 | @ OD mask |
| 11 | @ SiN etch |
| 12 | @ P-field mask |
| 13 | @ P-field implant |
| 14 | @ Field oxide |
| 15 | @ Gate oxide |
| 16 | @ HV gate oxide2 mask |
| 17 | @ Wet etch |
| 18 | @ Gate oxide |
| 19 | @ Vt implant |
| 20 | @ Poly deposition |
| 21 | @ N+ poly dope |
| 22 | @ Poly mask |
| 23 | @ Poly etch |
| 24 | @ NDD mask |
| 25 | @ NDD implant |
| 26 | @ NLDD mask |
| 27 | @ NLDD implant |
| 28 | @ TEOS deposition |
| 29 | @ Spacer dry etch |
| 30 | @ N+ mask |
| 31 | @ N+ S/D implant |
| 32 | @ P+ mask |
| 33 | @ P+ S/D implant |
| 34 | @ BPSG deposition |
| 35 | @ BPSG flow |
| 36 | @ Contact mask |
| 37 | @ Contact etch |
| 38 | @ Back-end metallization |
| 39 | @ Etc. |

At step 1, a wafer is made. Subsequently, different photoresists are deposited on a semiconductor substrate and then selectively patterned by the exposure and developing process. At step 2, a first photoresist is deposited as an N-type heavily doped buried layer (NBL) mask. At steps 3-4, an N-type heavily doped (N+) impurity ion is implanted into selected wafer region by the patterned NBL mask and is implanted with a certain depth. At step 5, P-epi deposition is performed to form a P-type epitaxy (P-epi) layer. Hence, in block 201, an NBL formation is implemented according to steps 1-5. The NBL formation can be optional in some HV applications.

The first photoresist is then removed from the wafer surface. At step 6, a second photoresist is deposited as an N-well mask. At steps 7-8, N-well is implanted using the patterned N-well mask and is implanted with a certain depth. Similarly, P-well implant is implemented at step 9. Hence, in block 203, an N-well formation is implemented in steps 6-8 and a P-well formation is implemented in step 9.

The second photoresist is then removed. At step 10, a third photoresist is deposited as an OD mask to define active areas. The third photoresist is then selectively etched by silicon nitride (SiN), e.g., SiN etching at step 11. After a removal of the third photoresist, a fourth photoresist is deposited as a P-field mask at step 12. After P-field is implanted at step 13, field oxidation is implemented at step 14. Hence, in block 205, field oxide layers/regions are formed according to steps 10-14.

Afterwards, gate oxidation is implemented at step 15. After a removal of the fourth photoresist, a fifth photoresist is deposited as a HV gate oxidation mask at step 16. At step 17, wet etching is performed. Then a second gate oxidation is implemented at step 18. As such, in block 207, a gate oxide layer is formed according to steps 15-18.

The fifth photoresist is then removed. At step 19, Vt implantation is implemented for regulating a threshold voltage value of MOS transistor(s). The polysilicon is doped at step 20. After a development of a sixth photoresist as a poly mask at step 22, polysilicon etching is performed at step 23. As such, in block 209, a polysilicon formation is completed according to steps 19-23.

After a removal of the sixth photoresist, a seventh photoresist is deposited as an NDD (N-type double diffused) mask at step 24. After the NDD mask deposition, the NDD implantation is implemented at step 25. In one embodiment, the NDD implantation is implemented at an implant dose approximately between 1.0E12 and 9.0E13 atoms/cm2. The dose can vary, but within a range such that the density of the NDD layer is less than that of an N+ layer formed in step 31 and a depth of the NDD layer is slightly greater than that of the N+ layer formed in step 31. As a result, in block 211, an NDD region (e.g., NDD layer) is formed according to steps 24-25.

After a removal of the seventh photoresist, an eighth photoresist is deposited as an NLDD (N-type lateral double diffused) mask at step 26. At step 27, NLDD implantation is implemented using the patterned NLDD mask. As a result, in block 213, an NLDD formation is implemented according to steps 26-27.

After the tetraethylorthosiliate (TEOS) deposition at step 28, spacer dry etching is performed at step 29. Hence, in block 215, a spacer formation is implemented according to steps 28-29.

After a removal of the eighth photoresist, a ninth photoresist is deposited as an N+ mask at step 30. Subsequently, an N+ source/drain (S/D) implantation is implemented at step 31. Similarly, a P-type heavily doped (P+) mask is used at step 32 and a P+ S/D implantation is implemented at step 33. Hence, in block 217, an S/D formation is implemented according to steps 30-33.

After BPSG deposition at step 34, boron phosphorus silicate glass (BPSG) flow is implemented at step 35 to smooth the surface of the aforementioned layers and/or regions. At steps 36-37, a mask is used and then an etching is performed to form different contacts. At step 38, a back-end metallization is implemented. Hence, in block 219, a back-end process is performed according to steps 34-38.

Therefore, in one embodiment, the co-existing of the LDMOS transistor and the DDDMOS transistor in the IC 100 is achieved by adding an NDD implant in the process. In one embodiment, the NDD implant can be added after the polysilicon formation and prior to spacer formation. In an alternative embodiment, the spacer formation (block 215, steps 28-29) can be implemented prior to the NDD mask and implantation procedures (block 211, steps 24-25). The process shown in Table 1 is for illustrative purposes and is not intended to be limited to such specific process.

Figure 3:
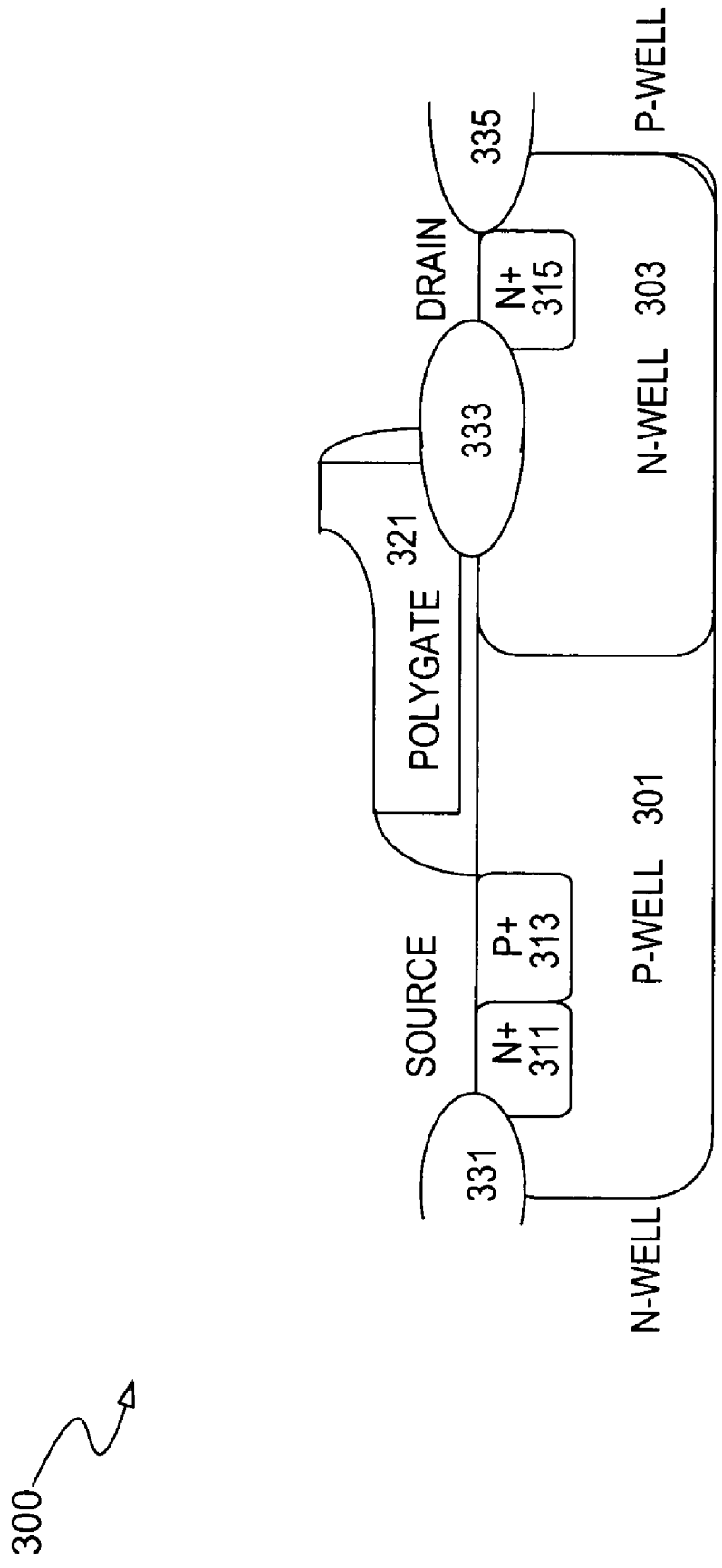
FIG. 3 illustrates a structure diagram of a lateral diffused metal oxide semiconductor (LDMOS) transistor, in accordance with one embodiment of the present invention.

FIG. 3 illustrates a structure diagram of a MOS transistor having a laterally diffused (LD) structure, e.g., a LDMOS transistor 300, in accordance with one embodiment of the present invention. The LDMOS transistor 300 is fabricated according to the manufacturing process shown in FIG. 2 and/or Table 1, and can be employed as a HV transistor in the controller circuitry 110 in FIG. 1. In one embodiment, the LDMOS transistor 300 can include a P-type well (P-well) 301, an N-type (N-well) 303, an N-type heavily doped (N+) layer/region 311, a P-type heavily doped (P+) layer/region 313, an N+ layer/region 315, and a polygate 321. The LDMOS transistor 300 can further include field oxide layers/regions 331, 333 and 335.

In one embodiment, the P-well 301 is adjacent to the N-well 303. The N+ layer 311 is adjacent to the P+ layer 313. The N+ layer 311 and the P+ layer 313 are formed within the P-well 301 at a predetermined depth to constitute a source region. The N+ layer 315 is formed within the N-well 303 at a predetermined depth to constitute a drain region. The polygate 321 is formed on the P-well 301 and the N-well 303 to constitute a gate region. Advantageously, the LDMOS transistor 300 demonstrates an enhanced reliability and is able to possess sufficient tolerance towards undesired electrical/voltage stress conditions, in one embodiment.

Figure 4:
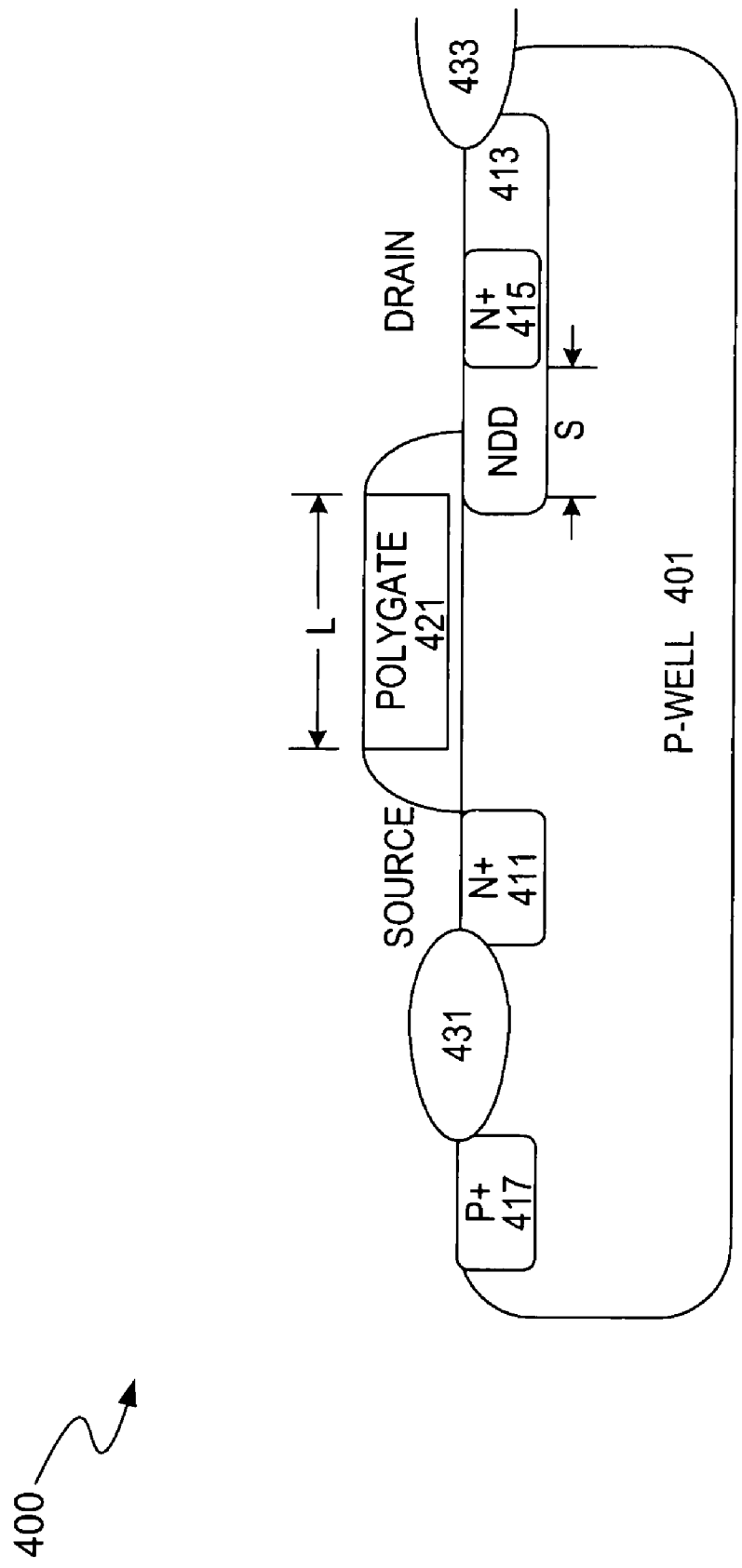
FIG. 4 illustrates a structure diagram of an asymmetric double diffused drain metal oxide semiconductor (DDDMOS) transistor, in accordance with one embodiment of the present invention.

FIG. 4 illustrates a structure diagram of a MOS transistor having a double diffused drain (DDD) structure, e.g., an asymmetric DDDMOS transistor 400, in accordance with one embodiment of the present invention. The DDDMOS transistor 400 is fabricated according to the manufacturing process in FIG. 2 and/or Table 1, and can be employed as the power MOSFET (e.g., a current switch or voltage switch) 120 in FIG. 1. The DDDMOS transistor 400 is featured by a higher breakdown voltage and hence the high voltage endurance capability of the DDDMOS transistor 400 is enhanced. In one embodiment, the DDDMOS transistor 400 can include a P-well 401, an N+ layer/region 411, an N-type double diffused (NDD) layer/region 413, an N+ layer/region 415, a P+ layer/region 417, and a polygate 421. The DDDMOS transistor 400 can further include field oxide layers/regions 431 and 433.

In one embodiment, the NDD layer 413 is formed between the polygate 421 and the N+ layer 415. Since the N+ layer is surrounded by a NDD layer, of which a density is less than that of the N+ layer, the punch-through capability of the DDDMOS transistor 400 can be enhanced. In addition, the distance 'S' between the polygate 421 and the N+ layer 415 will decrease the electronic field intensity, thus also improving a punch-through capability of the DDDMOS transistor 400. As a result, a breakdown voltage (e.g., between drain and source) of the DDDMOS transistor 400 can be increased.

In one embodiment, the N+ layer 411, the NDD layer 413 and the P+ layer 417 are formed within the P-well 401. The N+ layer 415 is formed within the NDD layer 413 that can be formed by phosphorus, or arsenic, etc., in one embodiment. The N+ layer 415 is surrounded by the NDD layer 413. A density of the N+ layer 415 is greater than that of the NDD layer 413, in one embodiment. The N+ layer 411 constitutes a source region of the DDDMOS transistor 400. The NDD layer 413 and the N+ layer 415 constitute a drain region of the DDDMOS transistor 400. The polygate 421 is formed on the P-well 401 and a predetermined region of the NDD layer 413 to constitute a gate region of the DDDMOS transistor 400. Advantageously, the DDDMOS 400 has a smaller size and a faster response, in one embodiment. In addition, by combining the NDD layer 413 with the N+ layer 415 in the drain region, the punch-through breakdown characteristics of the DDDMOS transistor can be improved.

Accordingly, in one embodiment, a method for integrating a switch (transistor switch) and a controller for controlling the switch are provided. In one embodiment, the method includes forming an NDD layer at an implant dose that is approximately between 1.0E12 and 9.0E13 atoms/cm2, and fabricating at least one transistor from a controller circuitry and a transistor switch on a single chip. The at least one transistor in the controller and the transistor switch can be high voltage transistors. The method further includes forming a spacer after formation of the NDD layer or prior to formation of the NDD layer. The method further includes forming an N-type heavily doped (N+) layer surrounded by the NDD layer. The depth of the N+layer is slightly less than that of the NDD layer, in one embodiment. The density of the N+layer is greater than that of the NDD layer, in one embodiment. The at least one transistor in the controller circuitry can be, but is not limited to, a lateral diffused metal oxide semiconductor (LDMOS) transistor. The transistor switch can be, but is not limited to, a double diffused drain metal oxide semiconductor (DDDMOS) transistor.

In one embodiment, an integrated circuit includes a switch including an N-type double diffused (NDD) layer, and a controller circuitry for controlling the switch. The controller circuitry and the switch are integrated on a single chip. The switch further includes an N-type heavily doped (N+) layer, and the NDD layer surrounds the N+ layer. The NDD layer and the N+ layer constitute a drain region of the switch. Advantageously, the fabrication technology technology in accordance with one embodiment of the present invention can integrate a switch and a controller circuitry on a single chip with reduced die size, enhanced reliability endurance in HV applications, and less cost.

The IC 100 can be used in many high voltage applications. In one embodiment, a display system includes a liquid crystal display (LCD) device and an inverter for converting a DC voltage to an AC voltage. The inverter includes a switch including an N-type double diffused (NDD) layer and a controller circuitry for controlling the switch. The controller circuitry and the switch are fabricated on a single chip. The switch further includes an N-type heavily doped (N+) layer surrounded by the NDD layer. The NDD layer and the N+ layer constitute a drain region of the switch. The NDD layer is formed at an implant dose that is approximately between 1.0E12 and 9.0E13/cm2. The controller circuitry includes, but is not limited to, one or more LDMOS transistors. The switch includes, but is not limited to, a DDDMOS transistor. The IC 100 can also be used in other high voltage applications, such as DC/DC converter and battery charger controller, etc.

Accordingly, in one embodiment, a switch 120 and a controller circuitry 110 for controlling the switch are integrated on a single IC 100. The IC 100 has an enhanced reliability and a smaller die size by using LDMOS transistors 300 in the controller and DDDMOS transistor 400 as the switch. In one embodiment, the IC 100 further enhances its reliability by an implantation of an NDD layer in the DDDMOS transistor 400, which results in an improvement of a punch-through capability of the DDDMOS transistor 400. Consequently, the IC 100 including the controller circuitry 110 and the switch 120 can be used in high voltage applications. Other types of transistors can also be used in the controller circuitry 110 and the switch 120 as long as within the sprit and scope of the invention.

The embodiments that have been described herein, however, are but some of the several that utilize this invention and are set forth here by way of illustration but not of limitation. It is obvious that many other embodiments, which will be readily apparent to those skilled in the art, may be made without departing materially from the spirit and scope of the invention as defined in the appended claims. Furthermore, although elements of the invention may be described or claimed in the singular, the plural is contemplated unless limitation to the singular is explicitly stated.

What is claimed is:

1. A method for fabricating an integrated circuit (IC), comprising:
fabricating a transistor of controller circuitry and a switch on a same semiconductor substrate for said IC, wherein said controller circuitry is operable for controlling said switch, and wherein said fabricating of said transistor and said switch comprises:
forming a first P-well for said switch on said same semiconductor substrate;
forming a second P-well and an N-well for said transistor on said same semiconductor substrate;
forming a first polygate for said switch on said first P-well;
forming a second polygate for said transistor on said second P-well and said N-well;
implanting N-type dopants in said first P-well to form an N-type double diffused (NDD) layer for said switch after formation of said first polygate;
implanting N-type dopants in said NDD layer to form a first N-type heavily doped (N+) layer for a drain of said switch, wherein said first N+ layer is surrounded by said NDD layer;
implanting N-type dopants in said first P-well to form a second N+ layer for a source of said switch;
implanting N-type dopants in said N-well to form a third N+ layer for a drain of said transistor; and
implanting N-type dopants in said second P-well to form a fourth N+ layer for a source of said transistor.

2. The method of claim 1, further comprising:
forming a spacer adjacent to said first polygate after formation of said NDD layer.

3. The method of claim 1, wherein said NDD layer is formed at an implant dose that is approximately between 1.0E12 and 9.0E13 atoms/cm2.

4. The method of claim 1, wherein a depth of said first N+ layer is less than that of said NDD layer, and wherein a density of said first N+ layer is greater than that of said NDD layer.

5. The method of claim 1, wherein said transistor from said controller circuitry comprises a lateral diffused metal oxide semiconductor (LDMOS) transistor.

6. The method of claim 1, wherein said switch comprises a double diffused drain metal oxide semiconductor (DDDMOS) transistor.

7. The method of claim 1, further comprising performing a plurality of steps in parallel, wherein said plurality of steps comprises said implanting N-type dopants in said NDD layer, said implanting N-type dopants in said first P-well, said implanting N-type dopants in said N-well, and said implanting N-type dopants in said second P-well.

8. The method of claim 7, further comprising:
forming a patterned photoresist film on said first P-Well, said second P-well, and said N-well; and
forming said first N+ layer, said second N+ layer, said third N+ layer, and said fourth N+ layer based on said patterned photoresist film.

9. The method of claim 1, further comprising performing a plurality of steps in parallel, wherein said plurality of steps comprises said forming of said first P-well and said forming of said second P-well.

10. The method of claim 1, further comprising performing a plurality of steps in parallel, wherein said plurality of steps comprises said forming of said first polygate and said forming of said second polygate.

11. The method of claim 1, further comprising
forming a distance between said first polygate and said first N+layer to enhance a breakdown voltage of said switch by forming said NDD layer adjacent to said first P-well and implanting N-type dopants in said NDD layer to form said first N+ layer.

12. The method of claim 1, further comprising:
fabricating a lateral diffused metal oxide semiconductor (LDMOS) transistor and a double diffused drain metal oxide semiconductor (DDDMOS) transistor on said same semiconductor substrate for said IC, wherein said transistor of said controller circuitry comprises said LDMOS transistor and said switch comprises said DDDMOS.

13. An integrated circuit (IC), comprising:
a switch comprising a first drain, a first source, and a first polygate, wherein said first drain comprises an N-type double diffused (NDD) layer adjacent to a first P-well and comprises a first N-type heavily doped (N+) layer surrounded by said NDD layer, wherein said first source comprises a second N+ layer adjacent to said first P-well, and wherein said first polygate is formed on said first P-well; and
controller circuitry operable for controlling said switch and comprising at least one transistor that comprises a second drain, a second source, and a second polygate, wherein said second drain comprises a third N+ layer adjacent to an N-well, wherein said second source comprises a fourth N+layer adjacent to said second P-well, wherein said second polygate is formed on said second P-well and said N-well, and wherein said first P-well, said second P-well, and said N-well are formed on a same semiconductor substrate of said IC.

14. The IC of claim 13, wherein a depth of said first N+ layer is less than that of said NDD layer, and wherein a density of said first N+ layer is greater than that of said NDD layer.

15. The IC of claim 13, wherein said controller circuitry comprises at least one lateral diffused metal oxide semiconductor (LDMOS) transistor.

16. The IC of claim 13, wherein said switch comprises a double diffused drain metal oxide semiconductor (DDDMOS) transistor.

17. The IC of claim 13, wherein said NDD layer is formed at an implant dose that is approximately between 1.0E12 and 9.0E13 atoms/cm2.

18. The IC of claim 13, wherein said transistor of said controller circuitry comprises a lateral diffused metal oxide semiconductor (LDMOS) transistor, and said switch comprises a double diffused drain metal oxide semiconductor (DDDMOS) transistor, and wherein said LDMOS and DDDMOS transistors are fabricated on said same semiconductor substrate of said IC.

* * * * *